(12) United States Patent
Lin

(10) Patent No.: US 7,728,646 B2
(45) Date of Patent: Jun. 1, 2010

(54) SOURCE FOLLOWER

(75) Inventor: Jr-Ching Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 65 days.

(21) Appl. No.: 11/967,263

(22) Filed: Dec. 31, 2007

(65) Prior Publication Data

US 2009/0121752 A1 May 14, 2009

(30) Foreign Application Priority Data

Nov. 13, 2007 (TW) ............................. 96142834 A

(51) Int. Cl.
*H03K 17/00* (2006.01)
(52) U.S. Cl. .................. 327/409; 326/82; 327/108; 327/112
(58) Field of Classification Search ............ None
See application file for complete search history.

(56) References Cited

U.S. PATENT DOCUMENTS

| 6,466,063 | B2* | 10/2002 | Chen | 327/112 |
| 7,196,556 | B1* | 3/2007 | Nguyen et al. | 327/108 |
| 7,315,195 | B2* | 1/2008 | Park | 327/536 |
| 7,511,530 | B1* | 3/2009 | Cox et al. | 326/30 |
| 2006/0049857 | A1* | 3/2006 | Song | 327/94 |
| 2006/0145735 | A1* | 7/2006 | Sakamoto et al. | 327/112 |
| 2006/0220704 | A1* | 10/2006 | Butler | 327/112 |
| 2007/0236440 | A1* | 10/2007 | Wacyk et al. | 345/92 |

* cited by examiner

*Primary Examiner*—Tuan Lam
*Assistant Examiner*—Hiep Nguyen
(74) *Attorney, Agent, or Firm*—Jianq Chyun IP Office

(57) ABSTRACT

A source follower includes first through third switches, first and second transistors, and a first capacitor. The first switch is used to determine whether or not to couple the source of the first transistor with an input signal. The second switch is used to determine whether or not to couple a gate and a drain of the first transistor with a first voltage. A first end of the first capacitor is coupled with a first control signal, and a second end of the first capacitor is coupled to the drain of the first transistor and a gate of the second transistor. The third switch is used to determine whether to or not couple a drain of the second transistor with the first voltage, and a source of the second transistor serves as an output of the source follower.

16 Claims, 5 Drawing Sheets

_US 7,728,646 B2_

SOURCE FOLLOWER

CROSS-REFERENCE TO RELATED APPLICATION

This application claims the priority benefit of Taiwan application serial no. 96142834, filed on Nov. 13, 2007. The entirety of the above-mentioned patent application is hereby incorporated by reference herein and made a part of this specification.

BACKGROUND OF THE INVENTION

1. Field of the Invention

The present invention generally relates to a follower, in particular, to a source follower.

2. Description of Related Art

Since liquid crystal should be driven by voltage, in a liquid crystal driving chip adopted by a liquid crystal display (LCD), voltage follower circuits of different architectures may be employed as output buffers. FIG. 1 shows an architecture of a conventional voltage follower circuit. Referring to FIG. 1, the voltage follower circuit is constituted by source followers 110 and 120. The source follower 110 includes switches 111, 113, 115 and NMOS transistors 112, 114. The source follower 120 includes switches 121, 123, 125 and PMOS transistors 122, 124. Further, in FIG. 1, VCC is the supply voltage, GND is the ground voltage, DATA is the input signal, OUT is the output signal, and SW1, SW2 are switch control signals for controlling the turn on/off of the switches.

The disadvantage of using the conventional source follower to realize the voltage follower circuit in FIG. 1 is that, the output voltage of the voltage follower circuit is limited by a threshold turn-on voltage (Vth) of the MOS transistor, and thus a rail-to-rail operation cannot be achieved. Referring to FIG. 1, the voltage level of the output signal OUT cannot reach the levels of the supply voltage VCC and the ground voltage GND. The reason of the above problem is explained with reference to FIG. 2.

FIG. 2 is a signal timing chart of the circuit in FIG. 1. Referring to FIGS. 1 and 2 together, during a pre-charging period of T2, the switch control signal SW1 is at a low level, and the switch control signal SW2 is at a high level for some time durations. During the period that the switch control signal SW2 is at a high level, the switches 111, 115, 121, 125 are turned off, and the switches 113, 123 are turned on, so a gate voltage $V_{NGATE}$ of the NMOS transistor 114 is charged to the level of the supply voltage VCC, and a gate voltage $V_{PGATE}$ of the PMOS transistor 124 is at the level of the ground voltage GND. During a data transmission period of T1, the switch control signal SW1 is at a high level, and the switch control signal SW2 is at a low level, so the switches 111, 115, 121, 125 are turned on, and the switches 113, 123 are turned off. At this time, as the gate voltage $V_{NGATE}$=DATA+$V_{GSN}$, the voltage level of the output signal OUT may be expressed by Formula (1) as follows:

$$V_{OUT}=(V_{NGATE}-V_{GSN})=(DATA+V_{GSN}-V_{GSN}) \qquad \text{Formula (1)}$$

where $V_{OUT}$ is a voltage level of the output signal OUT, and $V_{GSN}$ is a gate-source voltage of the NMOS transistors.

Seen from the Formula (1), $V_{OUT}$=DATA. However, when the highest voltage of the input signal DATA is equal to the level of the supply voltage VCC, as the gate voltage $V_{NGATE}$ can only be raised to the level of the supply voltage VCC at most, the highest voltage of the output signal OUT may be expressed by Formula (2) as follows:

$$V_{OUT}=(V_{NGATE}-V_{GSN})=(VCC-V_{GSN}) \qquad \text{Formula (2)}.$$

Thus, seen from Formula (2), when the level of the input signal DATA is equal to that of the supply voltage VCC, the highest voltage of the output signal OUT cannot reach the level of the supply voltage VCC. Similarly, when the lowest voltage of the input signal DATA is equal to the level of the ground voltage GND, as $V_{OUT}$=(GND+$V_{SGP}$), in which $V_{SGP}$ is a source-gate voltage of the PMOS transistors, the lowest voltage of the output signal OUT cannot reach the level of the ground voltage GND. Therefore, if the architectures of the source followers shown in FIG. 1 are employed to achieve a voltage follower circuit, the voltage swing of the output signal OUT may not reach the levels of the supply voltage VCC and the ground voltage GND, such that the voltage follower circuit cannot achieve the rail-to-rail operation.

SUMMARY OF THE INVENTION

Accordingly, present invention is directed to a source follower, in which the voltage level of an output signal of the source follower may reach the level of a supply voltage or a ground voltage.

The present invention is also directed to another source follower, which can be used to achieve a voltage follower circuit achieving the rail-to-rail operation.

As embodied and broadly described herein, the present invention provides a source follower including first through third switches, first and second transistors, and a first capacitor. A first end of the first switch receives an input signal. A first end of the second switch is coupled with a first voltage. A source of the first transistor is coupled to a second end of the first switch, and a gate and a drain of the first transistor are coupled to a second end of the second switch. A first end of the first capacitor receives a first control signal, and a second end of the first capacitor is coupled to the drain of the first transistor. A first end of the third switch is coupled with the first voltage. A gate and a drain of the second transistor are respectively coupled to the second end of the first capacitor and a second end of the third switch, and a source of the second transistor serves as an output of the source follower. In addition, during a first period, the first and the third switch are turned on, and the first control signal is at a first level. During a second period, the second switch is turned on for a first predetermined time duration, the first control signal changes from the first level to a second level, and sustains for a second predetermined time duration. Further, the first and the second predetermined time duration are partially overlapped, and an end time of the second predetermined time duration is after an end time of the first predetermined time duration.

As embodied and broadly described herein, the present invention further provides another source follower including first through third switches, first and second transistors, and a first charge pump. A first end of the first switch receives an input signal. A source of the first transistor is coupled to a second end of the first switch, and a gate and a drain of the first transistor are coupled together. The first charge pump is used for providing a first voltage. A first end of the second switch receives the first voltage, and a second end of the second switch is coupled to the drain of the first transistor. A first end of the third switch is coupled with a second voltage. A gate and a drain of the second transistor are respectively coupled to the second end of the second switch and a second end of the third switch, and a source of the second transistor serves as an output of the source follower. In addition, during a first period, the first and the third switch are turned on, and during a second period, the second switch is turned on for a predetermined time duration.

According to the present invention, the source follower employs a capacitor in conjunction with the switching of the switches to achieve the operation of the charge pumping, so as to raise or drop the gate voltage of the output transistor (i.e., the second transistor). Or, the source follower directly employs a charge pump in conjunction with the switching of the switches to raise or drop the gate voltage of the output transistor. Thus, the voltage level of an output signal of the source follower of the present invention may reach the level of a supply voltage or a ground voltage. Further, the source follower of the present invention may be used to realize a voltage follower circuit achieving the rail-to-rail operation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
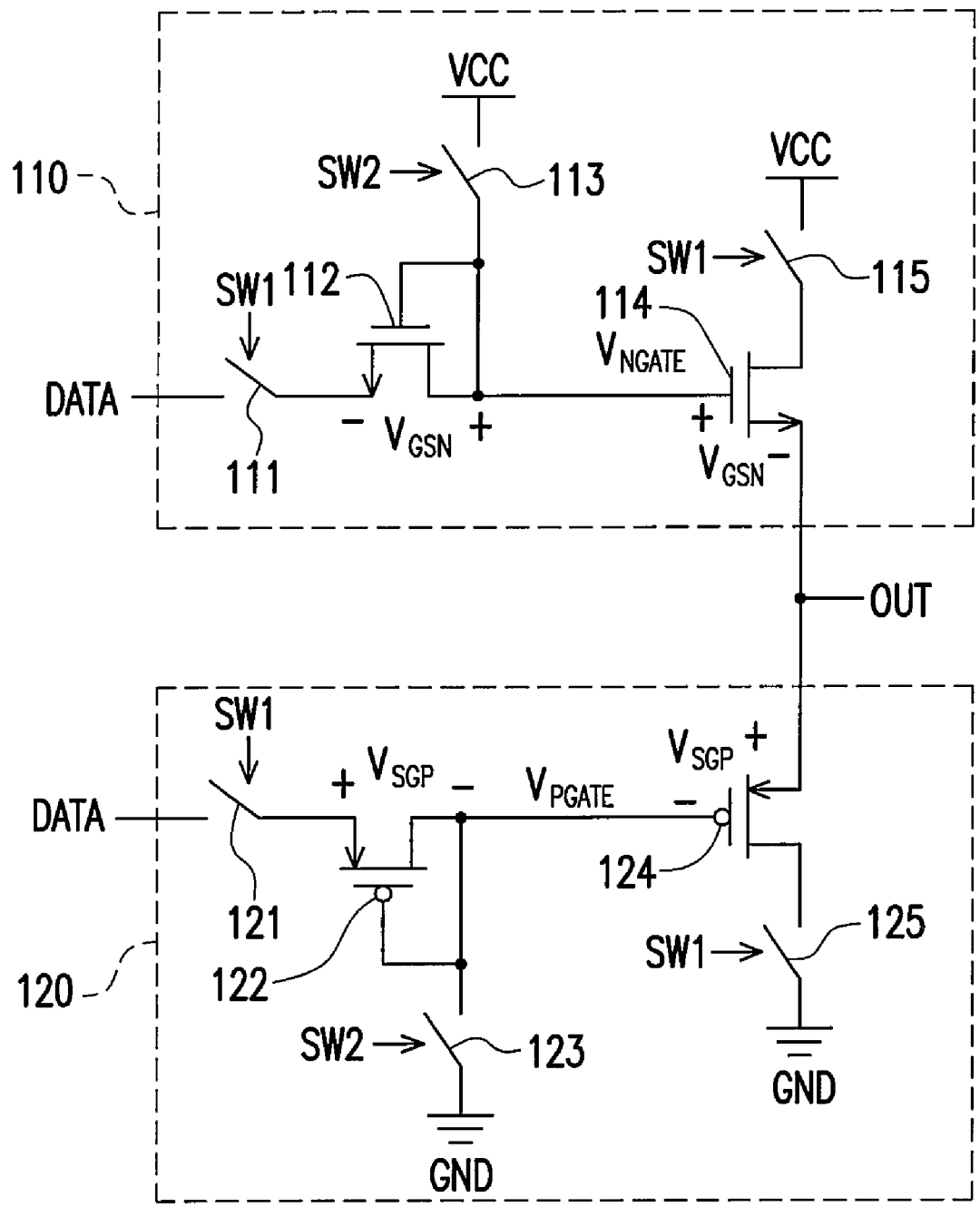
FIG. 1 shows an architecture of a conventional voltage follower circuit.

Reference will now be made in detail to the present preferred embodiments of the invention, examples of which are illustrated in the accompanying drawings. Wherever possible, the same reference numbers are used in the drawings and the description to refer to the same or like parts.

For the convenience of comparing with the conventional source follower, a source follower is used to realize a voltage follower circuit in the following embodiments, which is not intended to limit the scope of the present invention.

Figure 3:
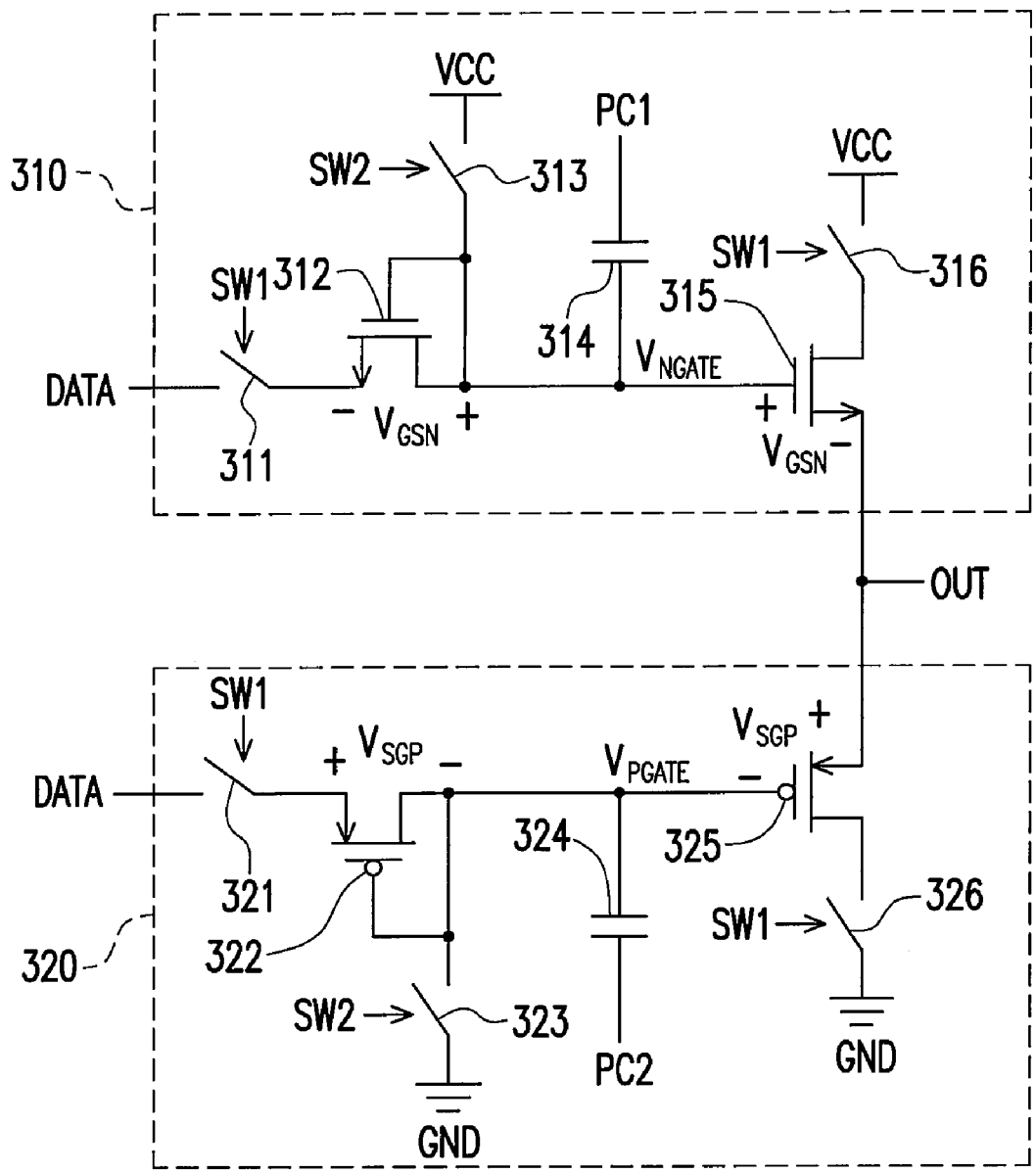
FIG. 3 is a circuit diagram of a voltage follower circuit according to an embodiment of the present invention.

FIG. 3 is a circuit diagram of a voltage follower circuit according to an embodiment of the present invention. Referring to FIG. 3, the voltage follower circuit is constituted by source followers 310 and 320. The source follower 310 includes switches 311, 313, 316, transistors 312, 315, and a capacitor 314. The source follower 320 includes switches 321, 323, 326, transistors 322, 325, and a capacitor 324. In this embodiment, the transistors 312, 315 are both NMOS transistors, and the transistors 322, 325 are both PMOS transistors. The coupling manner of the above components is shown in FIG. 3, and the details will not be described herein again. Further, in FIG. 3, VCC is the supply voltage, GND is the ground voltage, DATA is the input signal, OUT is the output signal, SW1 and SW2 are the switch control signals for controlling the turn on/off of the switches, PC1 and PC2 are the control signals for controlling the charging/discharging of the capacitors, $V_{GSN}$ is the gate-source voltage of the NMOS transistors, and $V_{SGP}$ is the source-gate voltage of the PMOS transistors.

Figure 4:
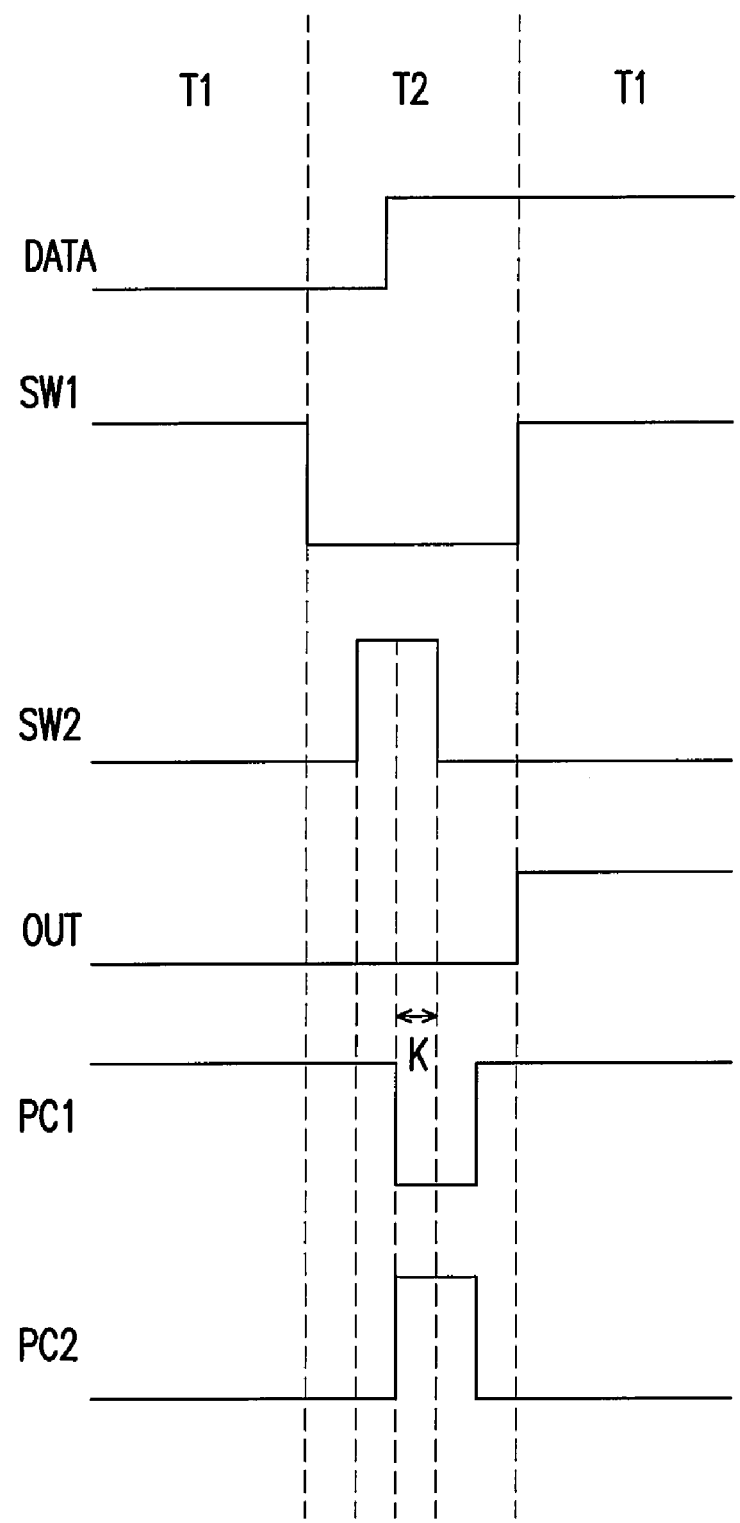
FIG. 4 is a signal timing chart of the circuit in FIG. 3.

FIG. 4 is a signal timing chart showing an embodiment of the circuit in FIG. 3. Referring to FIGS. 3 and 4 together, assuming that the voltage level of the control signals PC1, PC2 at a high level is equal to that of the supply voltage VCC, and the voltage level of the control signals PC1, PC2 at a low level is equal to that of the ground voltage GND. During a pre-charging period of T2 (i.e., a second period), the switch control signal SW1 is at a low level, and the switch control signal SW2 is at a high level for some time durations. Thus, the switches 311, 316, 321, 326 are turned off, and the switches 313, 323 are turned on for a first predetermined time duration. However, when the switches 313, 323 are turned on, the control signal PC1 changes from a high level to a low level, and sustains for a second predetermined time duration, and the control signal PC2 changes from a low level to a high level, and also sustains for the second predetermined time duration. Seen from FIG. 4, in detail, the first and the second predetermined time duration are partially overlapped, and the overlapped portion is marked by K. Therefore, during the overlapping period, the supply voltage VCC charges the capacitor 314, and the control signal PC2 charges the capacitor 324. At this time, the gate voltage $V_{NGATE}$ of the transistor 315 is at the level of the supply voltage VCC, and the gate voltage $V_{PGATE}$ of the transistor 325 is at the level of the ground voltage GND.

After the capacitors 314, 324 are charged, the switch control signal SW2 changes from a high level to a low level, so as to turn off the switches 313, 323, such that the gates of the transistors 315, 325 are floating. Then, the control signal PC1 restores the high level, and based on the charge conservation law, the gate voltage $V_{NGATE}$ of the transistor 315 is raised to a voltage level close to 2 VCC. Similarly, the control signal PC2 restores the low level, and based on the charge conservation law, the gate voltage $V_{PGATE}$ of the transistor 325 is lowered to a voltage level close to −VCC.

Referring to FIGS. 3 and 4 together, during a data transmission period of T1 (i.e., a first period), the switch control signal SW1 is at the high level, and the switches 311, 316, 321, 326 are turned on. When the switch control signal SW2 is at the low level, and the switches 313, 323 are turned off. Thus, the gate voltage $V_{NGATE}$ is discharged from a voltage level close to 2 VCC to a voltage level of DATA+$V_{GSN}$, and as $V_{OUT}=(V_{NGATE}-V_{GSN})$, in which $V_{OUT}$ is a voltage level of the output signal OUT, $V_{OUT}$=DATA. Similarly, the gate voltage $V_{PGATE}$ is charged from a voltage level close to −VCC to a voltage level of DATA−$V_{SGP}$, and as $V_{OUT}=(V_{PGATE}+V_{SGP})$, $V_{OUT}$=DATA. In this manner, even if the highest voltage of the input signal DATA is equal to the level of the supply voltage VCC, and the lowest voltage of the input signal DATA is equal to the level of the ground voltage GND, the voltage of the output signal OUT may still reach the levels of the supply voltage VCC and the ground voltage GND, so as to achieve the rail-to-rail operation. Definitely, the voltage level of the control signals PC1, PC2 at the high level may also be other values, and the selected value must be higher than or equal to $V_{GSN}$. It should be noted that, in FIG. 4, the control signal PC1 may be obtained by inverting and delaying the switch control signal SW2 for a small time duration, and the control signal PC2 may be obtained by inverting the control signal PC1, or by directly delaying the switch control signal SW2 for a small time duration.

In the signal timing listed in FIG. 4, a falling edge of a pulse of the control signal PC1 and a rising edge of a pulse of the control signal PC2 are both in a pulse enable period of the switch control signal SW2, and an overlapped portion K is formed for charging the capacitors. However, those skilled in the art should understand that, if the overlapped portion K is expanded, for example, the falling edge of a pulse of the control signal PC1 and the rising edge of a pulse of the control signal PC2 both at a rising edge of a pulse of the switch control signal SW2, or before a rising edge of a pulse of the switch control signal SW2 may be implemented as long as the capacitors are charged. Further, the end time of the second predetermined time duration must be after the end time of the first predetermined time duration, such that between the above two end times, the gates of the transistors 315, 325 are floating. Therefore, after the levels of the control signals PC1, PC2 are changed, the capacitor may be adopted to achieve the operation of the charge pumping.

Figure 5:
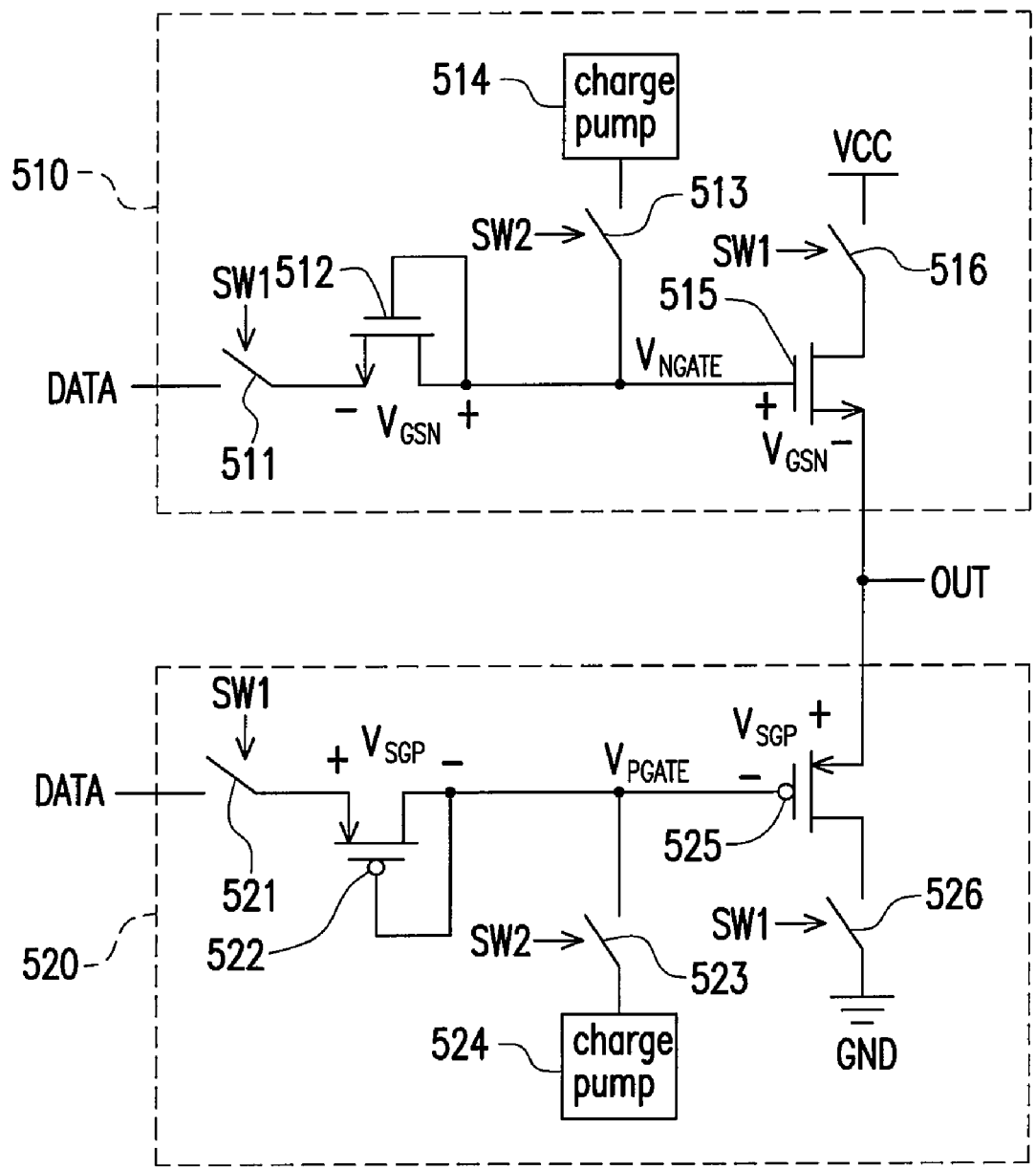
FIG. 5 is a circuit diagram of a voltage follower circuit according to another embodiment of the present invention.

Under the operating principle of the above embodiment, another voltage follower circuit may be derived, as shown in FIG. 5. FIG. 5 is a circuit diagram of a voltage follower circuit according to another embodiment of the present invention. Referring to FIG. 5, the voltage follower circuit is constituted by source followers 510, 520. The source follower 510 includes switches 511, 513, 516, transistors 512, 515, and a charge pump 514. The source follower 520 includes switches 521, 523, 526, transistors 522, 525, and a charge pump 524. The charge pumps 514, 524 are respectively used for providing voltages VA, VB. In this embodiment, the transistors 512, 515 are both NMOS transistors, and the transistors 522, 525 are both PMOS transistors. The coupling manner of the above components is shown in FIG. 5, and the details will not be described herein again. Further, in FIG. 5, VCC is a supply voltage, GND is a ground voltage, DATA is an input signal, OUT is an output signal, SW1 and SW2 are switch control signals for controlling the turn on/off of the switches, $V_{GSN}$ is a gate-source voltage of the NMOS transistors, and $V_{SGP}$ is a source-gate voltage of the PMOS transistors. The circuit in FIG. 5 may also be described by the signal timing in FIG. 2.

Figure 2:
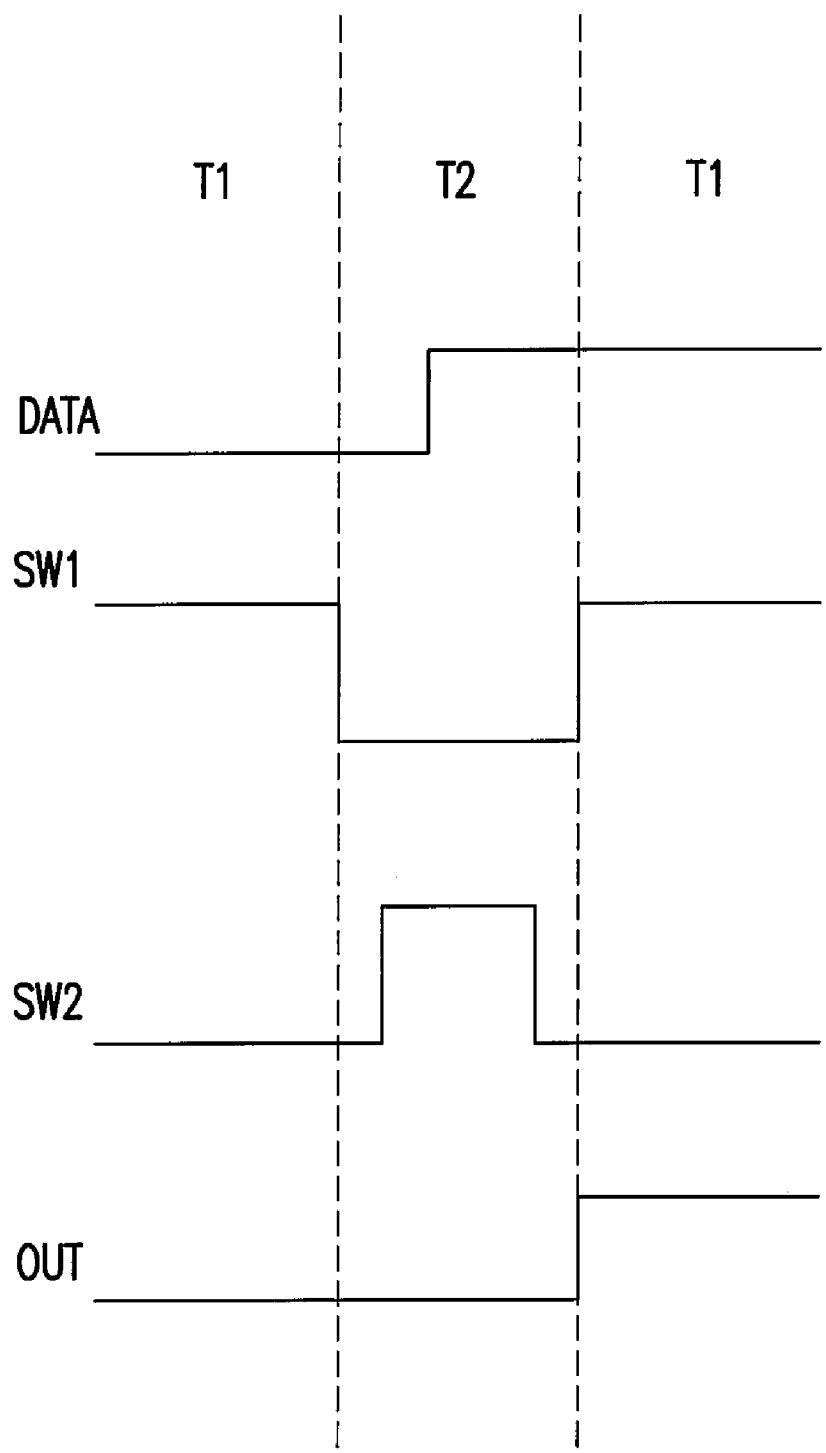
FIG. 2 is a signal timing chart of the circuit in FIG. 1.

Referring to FIGS. 2 and 5 together, during the pre-charging period of T2 (i.e., the second period), the switch control signal SW1 is at the low level, and the switch control signal SW2 is at the high level for some time durations. During the period that the switch control signal SW2 is at the high level, the switches 511, 516, 521, 526 are turned off, and the switches 513, 523 are turned on. Thus, the gate voltage $V_{NGATE}$ of the NMOS transistor 515 is charged to the level of the voltage VA, and the gate voltage $V_{PGATE}$ of the PMOS transistor 525 is at the level of the voltage VB. As long as the voltage VA is higher than or equal to VCC+$V_{GSN}$, and the voltage VB is lower than or equal to GND-$V_{SGP}$, the highest voltage of the input signal DATA is equal to the level of the supply voltage VCC, and the lowest voltage of the input signal DATA is equal to the level of the ground voltage GND. During the data transmission period of T1, the voltage of the output signal OUT may still reach the levels of the supply voltage VCC and the ground voltage GND, so as to achieve the rail-to-rail operation.

Definitely, in the above embodiments, the transistors are not limited to MOS transistors. That is, the voltage follower circuit may achieve the desired rail-to-rail operation as long as the transistors employed in a source follower are of the same type.

In view of the above, the source follower of the present invention employs a capacitor, and the switches are switched to achieve the operation of the charge pumping through the capacitor, so as to raise or drop the gate voltage of the output transistor (i.e., the second transistor). Or, the source follower directly employs the charge pump in conjunction with the switching of the switches to raise or drop the gate voltage of the output transistor. Thus, the voltage level of an output signal of the source follower of the present invention may reach the level of a supply voltage or ground voltage. Further, the source follower of the present invention may be used to realize a voltage follower circuit achieving the rail-to-rail operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A source follower, comprising:
   a first switch, having a first end for receiving an input signal;
   a second switch, having a first end coupled with a first voltage;
   a first transistor, having a source coupled to a second end of the first switch, and a gate and a drain coupled to a second end of the second switch;
   a first capacitor, having a first end for receiving a first control signal, and a second end coupled to the drain of the first transistor;
   a third switch, having a first end coupled with the first voltage; and
   a second transistor, having a gate and a drain respectively coupled to the second end of the first capacitor and a second end of the third switch, and a source serving as an output of the source follower,
   wherein during a first period, the first and the third switch are turned on, and the first control signal is at a first level; during a second period, the second switch is turned on for a first predetermined time duration, the first control signal changes from the first level to a second level, and sustains for a second predetermined time duration; the first and the second predetermined time duration are partially overlapped, and an end time of the second predetermined time duration is after an end time of the first predetermined time duration.

2. The source follower according to claim 1, wherein the first voltage is a supply voltage, and the first and the second transistor are N-type transistors.

3. The source follower according to claim 2, wherein the first level is higher than the second level.

4. The source follower according to claim 1, wherein the first voltage is a ground voltage, and the first and the second transistor are P-type transistors.

5. The source follower according to claim 4, wherein the first level is lower than the second level.

6. The source follower according to claim 1, further comprising:
   a fourth switch, having a first end for receiving the input signal;
   a fifth switch, having a first end coupled with a second voltage;
   a third transistor, having a source coupled to a second end of the fourth switch, and a gate and a drain coupled to a second end of the fifth switch;
   a second capacitor, having a first end for receiving a second control signal, and a second end coupled to the drain of the third transistor;
   a sixth switch, having a first end coupled with the second voltage; and
   a fourth transistor, having a gate and a drain respectively coupled to the second end of the second capacitor and a second end of the sixth switch, and a source coupled to the source of the second transistor,
   wherein the turn-on time of the fourth and the sixth switch is the same as that of the first switch, the turn-on time of the fifth switch is the same as that of the second switch, and the second control signal is an inverted signal of the first control signal.

7. The source follower according to claim 6, wherein the first voltage is a supply voltage, the second voltage is a ground voltage, the first and the second transistor are N-type transistors, and the third and the fourth transistor are P-type transistors.

8. The source follower according to claim 7, wherein the first level is higher than the second level.

9. A source follower, comprising:
a first switch, having a first end for receiving an input signal;
a first transistor, having a source coupled to a second end of the first switch, a gate and a drain coupled to the gate;
a first charge pump, for providing a first voltage;
a second switch, having a first end for receiving the first voltage, and a second end coupled to the drain of the first transistor;
a third switch, having a first end coupled with a second voltage; and
a second transistor, having a gate and a drain respectively coupled to the second end of the second switch and a second end of the third switch, and a source serving as an output of the source follower,
wherein during a first period, the first and the third switch are turned on, and the first control signal is at a first level; during a second period, the second switch is turned on for a first predetermined time duration, the first control signal changes from the first level to a second level, and sustains for a second predetermined time duration; the first and the second predetermined time duration are partially overlapped, and an end time of the second predetermined time duration is after an end time of the first predetermined time duration.

10. The source follower according to claim 9, wherein the second voltage is a supply voltage, and the first and the second transistor are N-type transistors.

11. The source follower according to claim 10, wherein the first voltage is higher than the second voltage.

12. The source follower according to claim 9, wherein the second voltage is a ground voltage, and the first and the second transistor are P-type transistors.

13. The source follower according to claim 12, wherein the first voltage is lower than the second voltage.

14. The source follower according to claim 9, further comprising:
a fourth switch, having a first end for receiving the input signal;
a third transistor, having a source coupled to a second end of the fourth switch, a gate and a drain coupled to the gate;
a second charge pump, for providing a third voltage;
a fifth switch, having a first end for receiving the third voltage, and a second end coupled to the drain of the third transistor;
a sixth switch, having a first end coupled with a fourth voltage; and
a fourth transistor, having a gate and a drain respectively coupled to the second end of the fifth switch and a second end of the sixth switch, and a source coupled to the source of the second transistor,
wherein the turn-on time of the fourth and the sixth switch is the same as that of the first switch, the turn-on time of the fifth switch is the same as that of the second switch.

15. The source follower according to claim 14, wherein the second voltage is a supply voltage, the fourth voltage is a ground voltage, the first and the second transistor are N-type transistors, and the third and the fourth transistor are P-type transistors.

16. The source follower according to claim 15, wherein the first voltage is greater than the second voltage, and the third voltage is less than the fourth voltage.

* * * * *